(12) United States Patent
Chang et al.

(10) Patent No.: US 12,368,018 B2
(45) Date of Patent: Jul. 22, 2025

(54) METHOD FOR ION IMPLANTATION UNIFORMITY CONTROL

(71) Applicant: Taiwan Semiconductor Manufacturing Co., Ltd., Hsinchu (TW)

(72) Inventors: Tien-Shun Chang, New Taipei (TW); Yu-Kang Liu, Taipei (TW); Su-Hao Liu, Jhongpu Township (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 564 days.

(21) Appl. No.: 17/684,876

(22) Filed: Mar. 2, 2022

(65) Prior Publication Data
US 2023/0016619 A1    Jan. 19, 2023

Related U.S. Application Data

(60) Provisional application No. 63/222,027, filed on Jul. 15, 2021.

(51) Int. Cl.
*H01J 37/317*    (2006.01)
*H01J 37/304*    (2006.01)
*H01L 21/66*    (2006.01)

(52) U.S. Cl.
CPC ........ *H01J 37/304* (2013.01); *H01J 37/3171* (2013.01); *H01L 22/10* (2013.01);
(Continued)

(58) Field of Classification Search
None
See application file for complete search history.

(56) References Cited

U.S. PATENT DOCUMENTS 8,309,938 B2 * 11/2012 Pandolfi ................ H01J 37/304
250/397
10,101,676 B2    10/2018 Fu et al.
(Continued)

FOREIGN PATENT DOCUMENTS

| EP | 2508903 B1 | 5/2016 |
|----|---|---|
| TW | 200623194 A | 7/2006 |
| TW | 202024581 A | 7/2020 |

*Primary Examiner* — Eliza W Osenbaugh-Stewart
(74) *Attorney, Agent, or Firm* — Slater Matsil, LLP (57) ABSTRACT

A method includes moving a plurality of sensors along a translation path with respect to an ion beam, acquiring sensor signals produced by the plurality of sensors, converting the acquired sensor signals into a data set representative of a two-dimensional (2D) profile of the ion beam, generating a plurality of first one-dimensional (1D) profiles of the ion beam from the data set, generating a plurality of second 1D profiles of the ion beam by spatially inverting each of the plurality of first 1D profiles, generating a plurality of third 1D profiles of the ion beam by superposing first current density values of each of the plurality of first 1D profiles with second current density values of a corresponding one of the plurality of second 1D profiles and determining whether to continue an implantation process with the ion beam in accordance with the plurality of third 1D profiles.

20 Claims, 7 Drawing Sheets (52) U.S. Cl.
CPC ............... *H01J 2237/24535* (2013.01); *H01J 2237/24542* (2013.01)

(56) References Cited

U.S. PATENT DOCUMENTS

| | | |
|---|---|---|
| 10,502,549 B2 | 12/2019 | Pandev |
| 2006/0097195 A1* | 5/2006 | Angel ................. H01J 37/3171 250/397 |
| 2006/0284114 A1* | 12/2006 | Olson ................. H01J 37/3171 250/492.21 |
| 2011/0042578 A1 | 2/2011 | Murrell et al. |
| 2013/0256566 A1* | 10/2013 | Kariya ................. H01J 37/304 250/492.21 |
| 2022/0042935 A1 | 2/2022 | Zhang et al. |

* cited by examiner

METHOD FOR ION IMPLANTATION UNIFORMITY CONTROL

PRIORITY CLAIM AND CROSS-REFERENCE

This patent application claims priority to U.S. Provisional Application No. 63/222,027 filed on Jul. 15, 2021 and entitled "A Method to Improve Ion Beam Uniformity by Calculation of Two-dimensional (2-D) Beam Profile," which application is hereby incorporated by reference herein as if reproduced in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies evolve, semiconductor fabrication processes have become more sophisticated and hence require complex equipment and fixtures. In the semiconductor process, integrated circuits are fabricated on a semiconductor wafer. The semiconductor wafer goes through many processing steps before a plurality of integrated circuits are separated by cutting the semiconductor wafer. The processing steps may include lithography, etching, doping, and depositing different materials.

Ion implantation is a processing technique for doping different atoms or molecules into a wafer. By employing ion implantation, the majority charge carrier may be altered so as to produce regions in the wafer having different types and levels of conductivity. In an ion implanter, an ion generator may generate an ion beam and direct the ion beam towards the target wafer.

A variety of ion implantation monitoring systems may be employed to characterize ion beams before an ion implantation process occurs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method for monitoring and controlling the uniformity of a first ion implantation process. The method may be applied to a variety of ion implantation processes and devices, such as high-energy ion implanters, high current ion implanters, medium current implanters or the like, and can be used to characterize ion beams before the first ion implantation process is performed. The embodiments include measuring a profile of an ion beam using an ion beam profiler. The ion beam profiler is configured to produce sensor signals in response to incident ions of the ion beam along a translation path with respect to the ion beam. The acquired sensor signals are representative of a two-dimensional (2D) profile of the ion beam. The 2D profile of the ion beam is then processed and compared to a baseline, "optimal" or "golden" beam profile to determine whether the first ion implantation process can proceed or if adjustments to the beam profile of the ion beam should be made. Advantageous features of embodiments disclosed herein include better ion beam uniformity tuning and improved ion implantation uniformity on the first wafer and during the first ion implantation process. In addition, the disclosed method may be integrated easily into existing processes without requiring any hardware changes, which reduces manufacturing costs.

Figure 1:
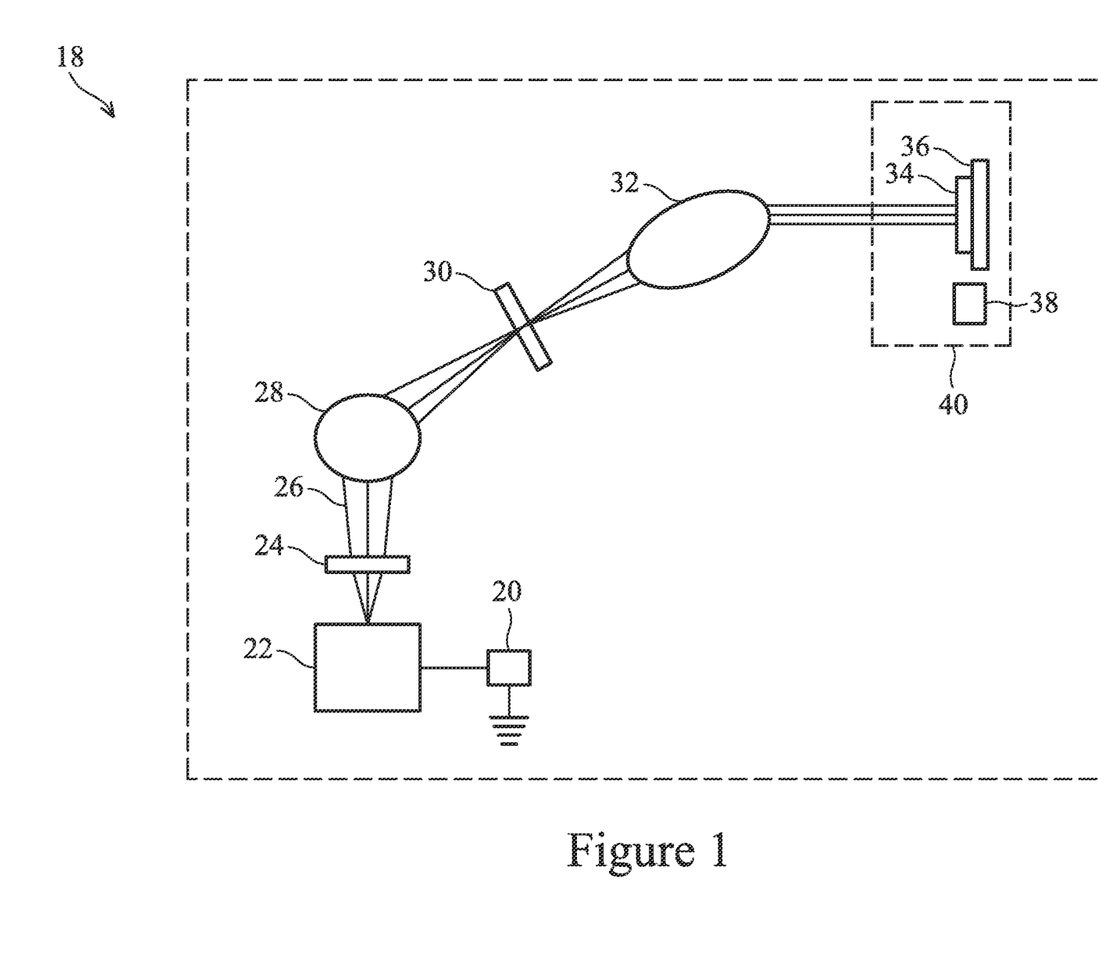
FIG. 1 illustrates a schematic diagram of an ion implantation system, in accordance with an embodiment.

FIG. 1 illustrates an embodiment ion implantation system 18 that is housed in a high-vacuum environment. The ion implantation system 18 may comprise an ion source 22 that is used to generate ions and supply an ion beam 26. A gas is supplied to the ion source 22 where the gas is ionized and the ions extracted to form the ion beam 26. The ion source 22 is powered by a power supply 20. The ion implantation system 18 comprises one or more extraction electrodes 24 to extract ions from the ion source 22 and direct the ion beam 26 towards a mass analyzer magnet 28. The mass analyzer magnet 28 is used to deflect ions in the ion beam 26 such that only a desired ions species may pass through a mass resolving aperture 30. The ion beam 26 traveling through the mass resolving aperture 30 may pass through a corrector magnet 32 that is used to convert the ion beam 26 from a diverging ion beam to one that has substantially parallel ion trajectories (e.g., a ribbon ion beam). The corrector magnet 32 also directs the ion beam 26 towards a wafer 34 that is supported on a movable stage 36 of an end station 40.

The wafer 34 may be made of silicon or other semiconductor materials such as silicon germanium, or the like. The wafer 34 may go through many processing steps such as lithography, etching, doping before a completed die is formed. During a doping process, the wafer 34 may be placed on the movable stage 36 for an ion implantation process. The quality of the completed die may depend largely on the uniformity of ions embedded in the wafer 34. For example, an uneven distribution of ions in the wafer 34 may cause a poor drive current uniformity (IDU) or threshold voltage uniformity (VTU) in transistors of the wafer 34.

Referring further to FIG. 1, the end station 40 comprises the movable stage 36 on which the wafer 34 or another single workpiece (e.g., a, display panel or other substrate) is supported along the beam path of the ion beam 26 for implantation with ions. In an embodiment, the ion implantation system 18 provides the generally stationary ion beam 26 having a rectangular cross section (e.g., also referred to as a "ribbon beam"), wherein the movable stage 36 (and therefore the wafer 34 supported on the movable stage 36) can be translated (e.g., moved) along two generally orthogonal axes with respect to the stationary ion beam 26. In other embodiments, the ion implantation system 18 provides the generally stationary ion beam 26 having a circular cross section (e.g., also referred to as a "spot beam" or a "pencil beam").

The end station 40 may also include an ion beam profiler 38. The ion beam profiler 38 is configured to acquire a profile of a cross section of the ion beam 26, typically in a plane orthogonal to the direction of ion beam transport. In an embodiment in, the ion beam 26 may have a rectangular cross section in which a major dimension of the ion beam 26 cross section is larger than the dimensions of the ion beam profiler 38. In an embodiment, the ion beam profiler 38 is configured to acquire a profile of a cross section of the ion beam 26 in a plane in or near the plane of wafer 34. However, ion beam profiler 38 may acquire the ion beam profile in any desired plane. Before an ion implantation process (e.g., such as implantation process 100 shown in FIG. 3A) is performed on the wafer 34, ion beam 26 may be characterized by using the ion beam profiler 38 to obtain the beam profile of the ion beam 26. The beam profile of the ion beam 26 is then compared to an "optimal" or "golden" beam profile (e.g., optimal beam profile 90 as described below in FIGS. 2A through 3F acquired from a plurality of ion implantation processes 100). If the beam profile of the ion beam 26 has a standard deviation of less than a preset threshold (e.g., 0.07) as compared to the optimal beam profile 90, the ion implantation process 100 may then be performed on the wafer 34. If the standard deviation of the beam profile from the optimal beam profile 90 is equal to or greater than the preset threshold, the ion implantation 100 process on the wafer 34 does not proceed and an ion beam tuning process is then performed to bring the standard deviation of the beam profile as compared to the optimal beam profile 90 to less than the preset threshold. In an embodiment, acquiring the beam profile of the ion beam 26 and comparing it to the optimal beam profile 90 may be carried out while the wafer 34 is present in the end station 40 and supported on the movable stage 36. In an embodiment, acquiring the beam profile of the ion beam 26 and comparing it to the optimal beam profile 90 may be carried out without the wafer 34 being present and having been introduced into the end station 40.

Figure 2A:
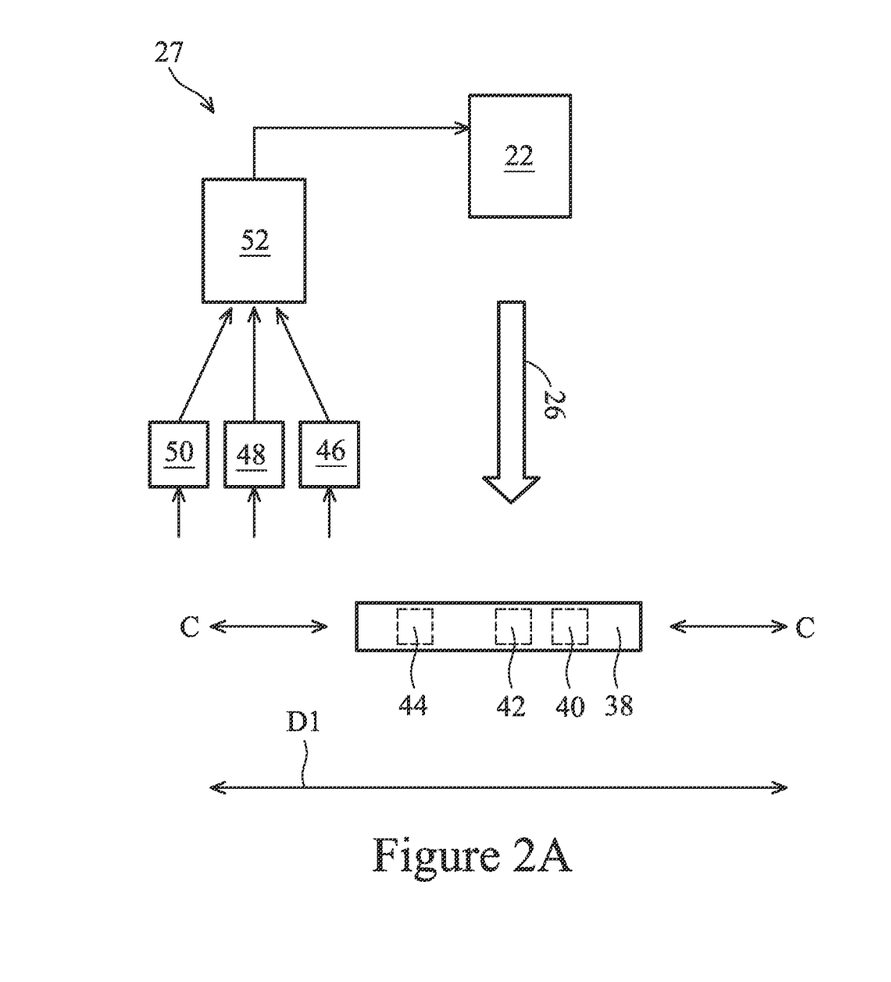
FIGS. 2A and 2B illustrate a schematic diagram of apparatus for measuring a two-dimensional (2D) profile of an ion beam, in accordance with an embodiment.

FIGS. 2A through 3F describe the measuring of a 2D profile of the ion beam 26 using the ion beam profiler 38 prior to performing the implantation process 100 on the wafer 34. The 2D profile of the ion beam 26 is then processed and compared to a baseline, optimal beam profile 90 to determine whether the implantation process 100 can proceed or if adjustments to the beam profile of the ion beam 26 need to be made. FIG. 2A illustrates a schematic diagram of the ion implantation system 18, in accordance with an embodiment. FIG. 2B illustrates a side-view of the ion beam profiler 38 of FIG. 2A showing its orientation in two directions (e.g., direction B-B and direction C-C). FIG. 3A illustrates a flowchart diagram that shows a feedback control system for monitoring and controlling the uniformity of the ion implantation process 100. Before an ion implantation process (e.g., such as implantation process 100 shown in FIG. 3A) is performed on the wafer 34 (shown previously in FIG. 1), an ion beam 26 may be characterized by the controller 52 using the ion beam profiler 38 to obtain the beam profile of the ion beam 26. The beam profile may be used to determine whether the ion implantation process 100 may proceed or if adjustments to the beam profile of the ion beam 26 are desired. The ion implantation system 18 comprises the ion source 22 and an ion beam characterizer 27. The ion beam characterizer 27 comprises the ion beam profiler 38; a plurality of sensors 40, 42, and 44; a plurality of current meters 46, 48, and 50; and a controller 52. As shown in FIG. 2A, the ion source 22 generates the ion beam 26 and directs the ion beam 26 towards the ion beam profiler 38.

The ion beam profiler 38 includes a plurality of sensors 40/42/44 mounted to a frame or housing 39. The sensed signals from the plurality of sensors 40/42/44 are sent to a plurality of current meters (e.g., current meters 46/48/50). Each of the current meters 46/48/50 may be coupled to a respective one of the plurality of sensors 40/42/44. In accordance with an embodiment, a Faraday detector such as a Faraday cup may be configured to sense ion particles from the ion beam 26 and convert the number of sensed ion particles into a current value. For example, each of the plurality of sensors 40/42/44 and its corresponding current meter 46/48/50 may be replaced by a Faraday cup.

Figure 2B:
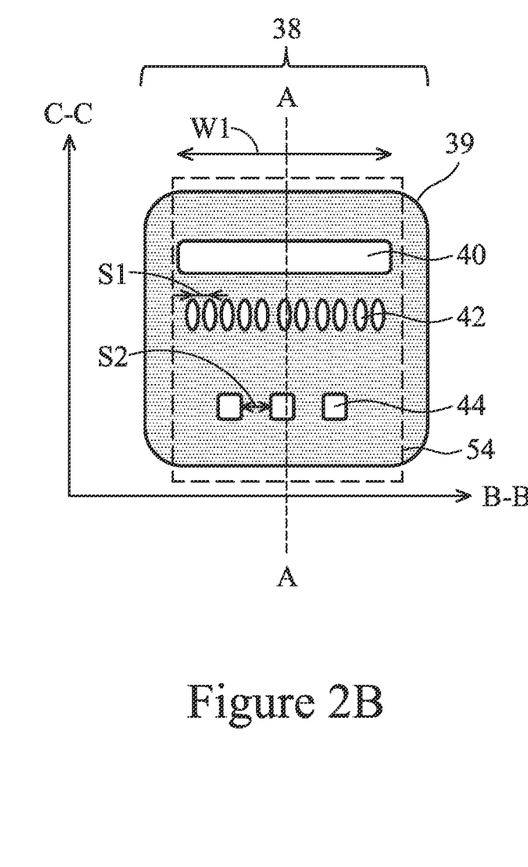

As shown in FIG. 2B, the ion beam profiler 38 includes the plurality of sensors 40/42/44, wherein the plurality of sensors 42 are disposed above the sensors 44, and the sensor 40 is disposed above the plurality of sensors 42. Other configurations of the plurality of sensors 40/42/44 are also possible in other embodiments. The sensor 40 (which may comprise a Faraday cup) is configured for measuring the one-dimensional (1D) profile of ion beam 26. The plurality of sensors 42 (each of which may comprise a Faraday cup) are configured for collectively measuring the two-dimensional (2D) profile of ion beam 26. In an embodiment, the ion beam profiler 38 may comprise eleven or more sensors 42, which are spaced out in a linear fashion in the B-B direction. In an embodiment, the spacing S1 between adjacent ones of the plurality of sensors 42 is the same. The plurality of sensors 44 (each of which may comprise a Faraday cup) are configured for measuring the angle profile of a cross section of the ion beam 26, where the plane of ion beam transport is not orthogonal to the plane of the major surface of the ion beam profiler 38. The plurality of sensors 44 may be spaced out in a linear fashion in the B-B direction. In an embodiment, the spacing S2 between adjacent ones of the plurality of sensors 44 is the same. In an embodiment, other configurations and arrangements of the plurality of sensors 40/42/44 may be utilized within the scope of the invention.

Figure 3A:
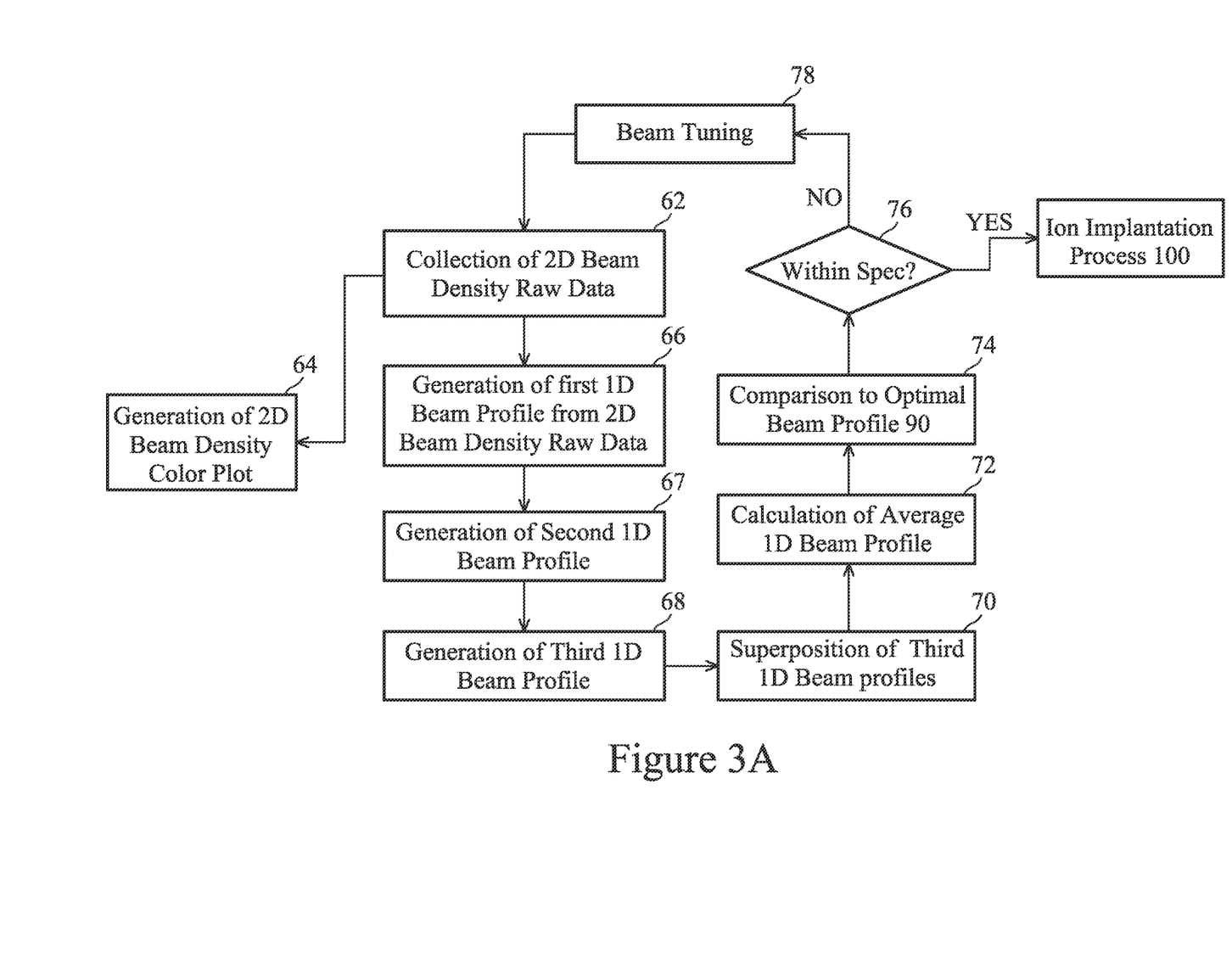
FIG. 3A illustrates a flowchart diagram for a system used for monitoring and controlling the uniformity of an ion implantation process.

FIG. 3A describes an ion beam profiling process. Starting in block 62 of FIG. 3A, beam current density measurements are taken to generate a two-dimensional (2D) profile of the ion beam 26. In block 62, the ion beam profiler 38 (and therefore the plurality of sensors 40/42/44) is translated (e.g., moved) along a translation path in the C-C direction by a translation mechanism controlled by controller 52 in order to cover the entire cross-sectional area of the ion beam 26. Beam current density measurements are acquired from each of the plurality of sensors 42 translated along the translation path. The beam current density measurements may be acquired when the ion beam profiler 38 is in motion, or when the ion beam profiler 38 is translated using discrete movements (e.g., each time the ion beam profiler 38 stops along translation path).

In an embodiment, thirty two or more separate beam current density measurements are taken as the ion beam profiler 38 (and therefore the plurality of sensors 42) is translated along the translation path in the C-C direction. The ion beam profiler 38 may comprise eleven or more of the sensors 42, which are spaced out in a linear fashion in the B-B direction (as shown previously in FIG. 2B). The ion beam 26 may have a certain width, and the eleven or more sensors 42 spaced out linearly in the B-B direction measure the ion beam 26 across it's width at discrete intervals. In this way, the set of beam current density measurements by the plurality of sensors 42 as the ion beam profiler 38 is translated across the ion beam 26 represents a two-dimensional (2D) map of beam current density (or 2D beam profile) of the ion beam 26 in both the B-B and C-C directions. In an alternate embodiment, the ion beam profiler 38 may comprise less than or more than eleven sensors 42, which are spaced out in a linear fashion in the B-B direction. In an embodiment, the ion beam profiler 38 is translated along the translation path in the C-C direction by a distance D1 that may be in a range from −200 mm to +200 mm.

The plurality of sensors 42 measure beam current in incremental areas over the cross-sectional area of the ion beam 26 to collectively obtain a beam profile in the form of a two-dimensional (2D) map of beam current density. The two-dimensional (2D) map is a spatially accurate map of the beam current density and may be configured such that each incremental area of the beam cross section contains a measured value of beam current density. Current signals (e.g., electrical charge) may be produced from the current meter 48 or each of the plurality of sensors 42 (e.g., when each of the plurality of sensors 42 comprise a Faraday cup) as the ion beam profiler 38 is translated (e.g., moved) along the translation path and the ion beam 26 impinges on the respective ones of the plurality of sensors 42. The current signals from the current meter 48 or plurality of sensors 42 (e.g., when each of the plurality of sensors 42 comprise a Faraday cup) are sent to the controller 52. The controller 52 correlates the time dependence of the signals from each of the plurality of sensors 42 with scanned positions of the ion beam 26 and computes the spatially accurate two-dimensional map of the beam current density.

Figure 3B:
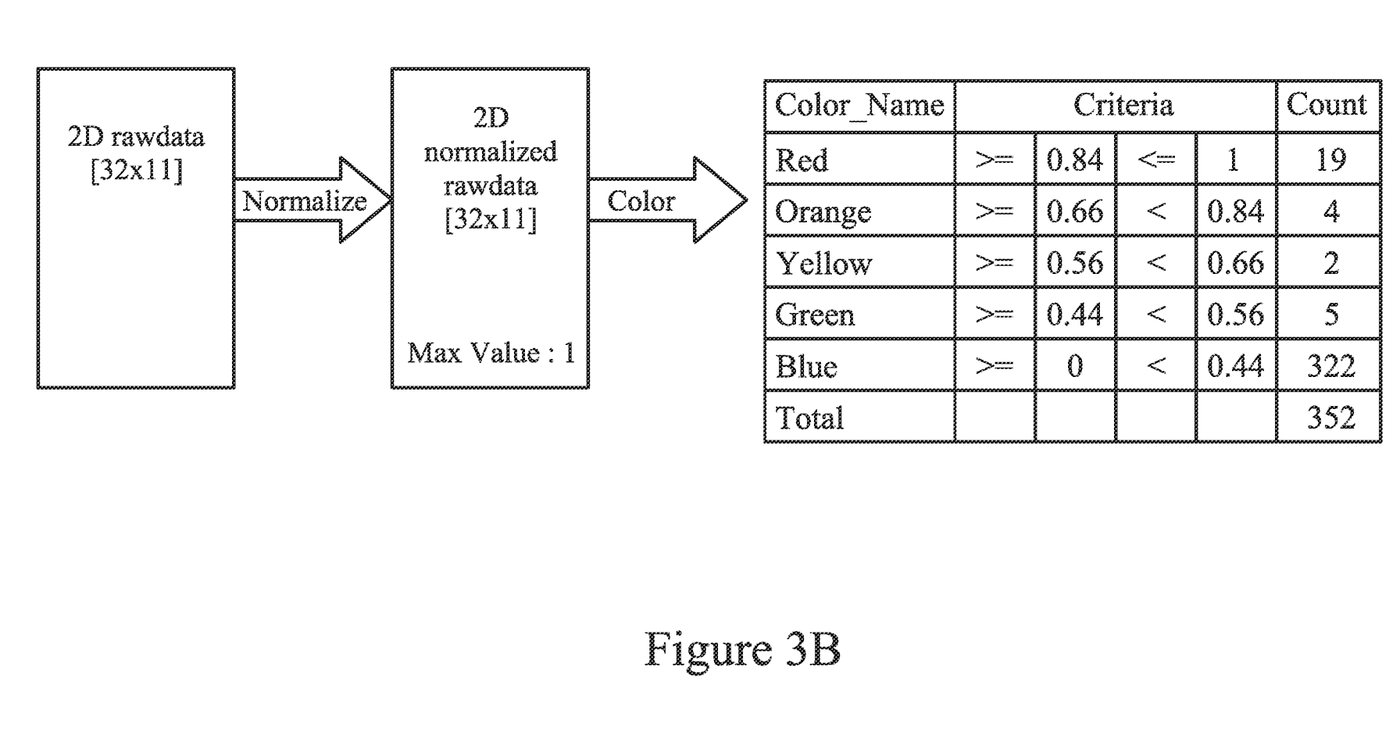
FIG. 3B illustrates a method for normalizing beam current measurements, in accordance with an embodiment.
Figure 3C:
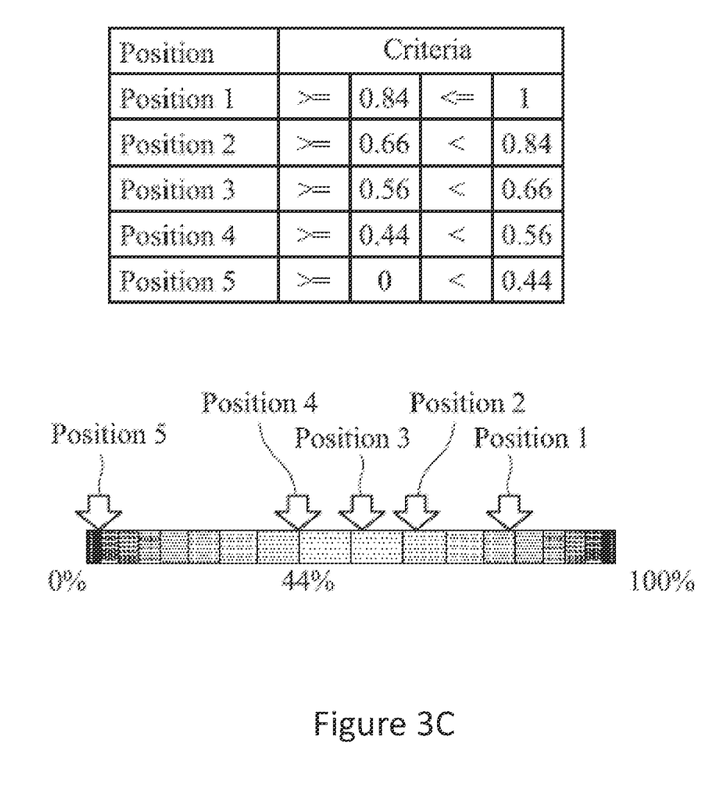
FIG. 3C illustrates a scale bar of an example two-dimensional color plot of an ion beam profile.

The set (also referred to as data set) of current density measurements (or 2D raw data) collected in flowchart block 62 are then used by the controller 52 to generate a 2D color display or plot of the ion beam profile in flowchart block 64 of FIG. 3A. As shown in FIG. 3B, the acquired beam current measurements are normalized to a range of values from a minimum value of 0 (e.g., for the lowest measured beam current) to a maximum value of 1 (e.g., for the highest measured beam current). The acquired beam current density measurements can also be alternatively normalized to percentage values from a minimum value of 0 percent to a maximum value of 100 percent. Different sub-ranges of these normalized beam current density values from 0 to 1 (or 0 percent to 100 percent) are assigned to different colors and the normalized beam current density measurements are output or displayed in the form of a 2D color plot that is configured to comprise square-like points, each of which contains a color to represent the measured value of beam current density in that incremental area of the ion beam 26 cross section. FIG. 3C illustrates a scale bar of an example two-dimensional color plot of an ion beam profile in which different positions on the scale bar represent different colors. Each color of each sub-range of the normalized beam current values may have different tones of the color to represent areas with larger or smaller beam current densities within the sub-range. In an embodiment, the measured beam current density values may be normalized such that the color blue is assigned to normalized beam current values in a range from 0 to any value less than 0.44, the color green is assigned to normalized beam current density values in a range from 0.44 to any value less than 0.56, the color yellow is assigned to normalized beam current density values in a range from 0.56 to any value less than 0.66, the color orange is assigned to normalized beam current density values in a range from 0.66 to any value less than 0.84, and the color red is assigned to normalized beam current density values in a range from 0.84 to 1.

Normalizing the 2D beam current density measurements of the ion beam 26 collected (shown in flowchart block 62 of FIG. 3A) to a range of values from a minimum value of 0 (e.g., for the lowest measured beam current) to a maximum value of 1 (e.g., for the highest measured beam current) and then generating a 2D color display or plot of the ion beam profile has advantages. A large range of colors can be used in the 2D color plot making differences in the beam profile of the ion beam 26 easily observable. In addition, assigning the different colors to the normalized beam current density measurements as described above allows for normalized beam current densities above 0.44 to be observable in a larger number of colors and color tones, making differences in beam current densities of the ion beam 26 easily distinguishable.

Figure 3D:
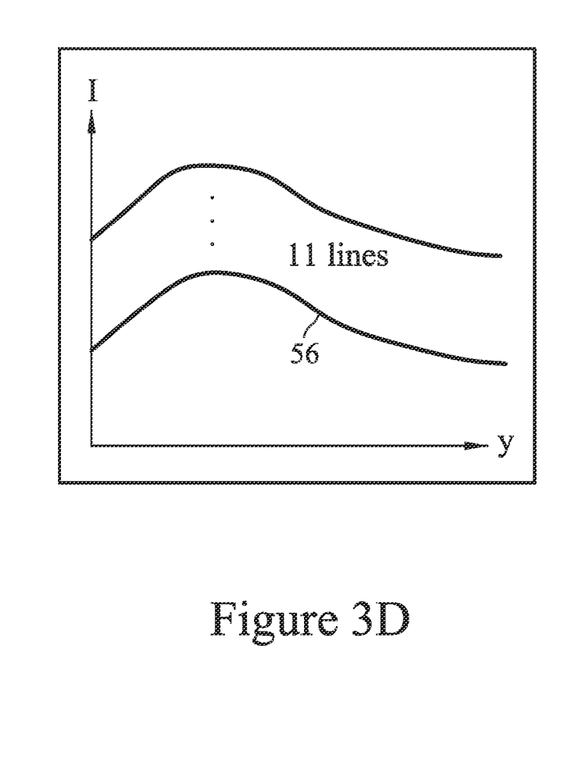
FIGS. 3D and 3E illustrates a method for generating a plurality of one-dimensional (1D) beam profiles, in accordance with an embodiment.
Figure 3E:
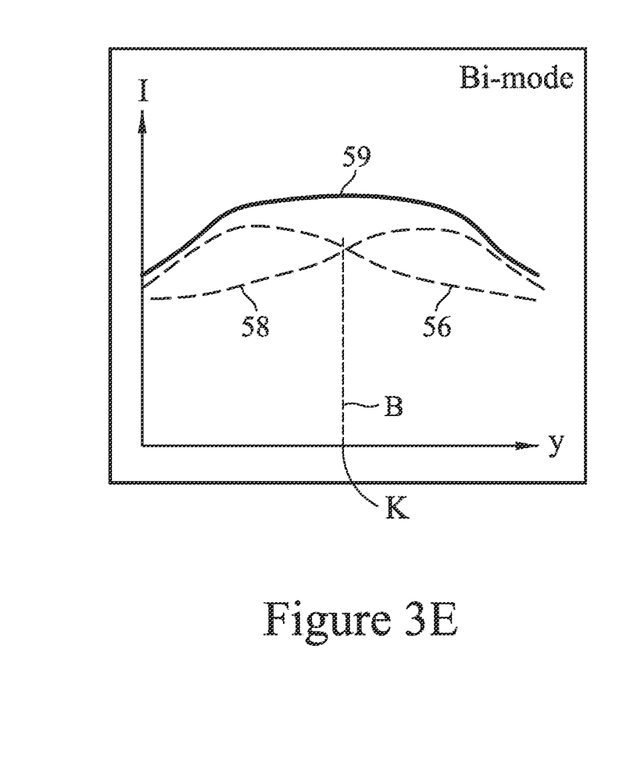
Figure 3F:
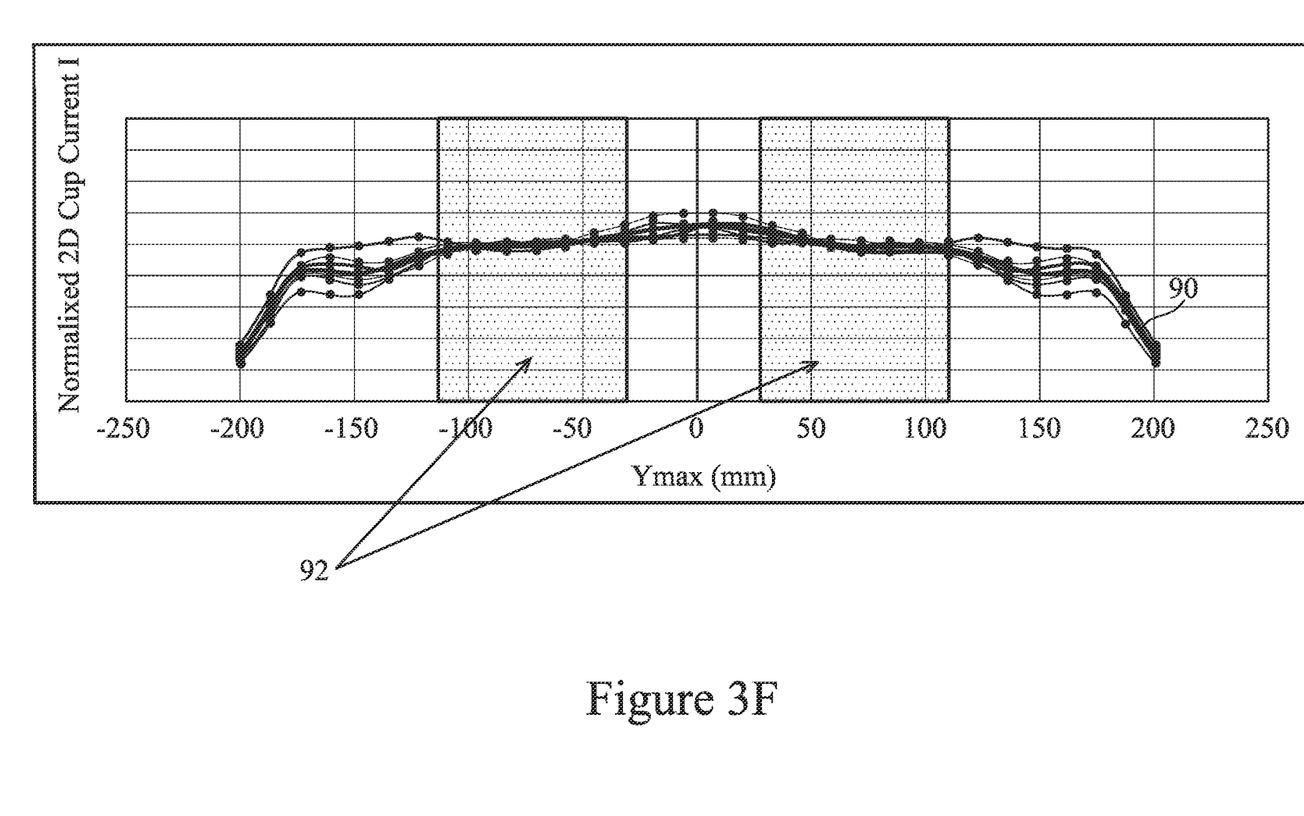
FIG. 3F illustrates an optimal beam profile, in accordance with an embodiment.

The set (also referred to as data set) of beam current density measurements (or 2D raw data) collected during the step shown in flowchart block 62 are also subsequently used to generate a plurality of first one-dimensional (1D) profiles of the ion beam 26 in the step shown in flowchart block 66 of FIG. 3A. As shown in FIG. 3D, the controller 52 may generate a plurality of first 1D beam profiles from the 2D beam current density measurements taken by the plurality of the sensors 42 of the ion beam profiler 38. Each first 1D beam profile is generated by plotting the beam current density values measured by each of the plurality of sensors 42 (from the 2D raw data of flowchart block 62 above) along a single axis to create a spatially accurate one-dimensional view of the ion beam 26. Each first 1D beam profile therefore contains information about a particular cross-sectional portion of the ion beam 26. The number of first 1D beam profiles generated may be the same as the number of sensors 42 present in the ion beam profiler 38 (e.g., 11 first 1D beam profiles are generated if the ion beam profiler 38 has eleven of the sensors 42). In an embodiment, only the beam current density measurements (or 2D raw data) collected from a region 54 (shown in FIG. 2B) of the ion beam profiler 38 are used to generate the plurality of first 1D beam profiles. In an embodiment, the region 54 may have a width that is in a range from 100 mm to 150 mm. For example, the beam current measurements (2D raw data) may be collected within the region 54 to generate the plurality of first 1D beam profiles, where the region 54 extends from −50 mm to +50 mm on either side of a center line A-A (shown in FIG. 2B) of the region 54, wherein the center line A-A is also a center line of the ion beam profiler 38. In an embodiment, the number of first 1D beam profiles generated is the same as the number of sensors 42 present within the region 54 (e.g., 11 first 1D beam profiles are generated if the region 54 has eleven of the sensors 42).

In the step shown in flowchart block 67, a plurality of second spatially inverted 1D beam profiles are subsequently generated for the plurality of first 1D beam profiles that were generated during the step shown in flowchart block 66 of FIG. 3A. Each of the plurality of second 1D beam profiles is generated for a corresponding one of the plurality of first 1D beam profiles. Each second 1D beam profile (e.g., second 1D beam profile 58 in FIG. 3E) is obtained by spatially inverting its corresponding first 1D beam profile (e.g., first 1D beam profile 56 in FIGS. 3D and 3E) along the translation path (e.g., in the C-C direction) in which the ion beam profiler 38 is translated. In some embodiments, each of the second 1D beam profiles (e.g., second 1D beam profile 58 in FIG. 3E) is a mirror image of a respective one of the first 1D beam profiles (e.g., first 1D beam profile 56 in FIGS. 3D and 3E) with respect to a line (e.g., line E in FIG. 3E) passing through a first point (e.g., point K in FIG. 3E) along the translation path (e.g., the C-C direction).

Subsequently, in flowchart block 68, the controller 52 calculates a plurality of third 1D beam profiles from the second 1D beam profiles and their corresponding first 1D beam profiles. To calculate each of the plurality of third 1D beam profiles (e.g., third 1D beam profile 59), the beam current density values of each spatially inverted second 1D beam profile (e.g., second 1D beam profile 58 in FIG. 3E) are added to (or superposed with) the beam current density values of its corresponding first 1D beam profile (e.g., first 1D beam profile 56 in FIG. 3E) with respect to a first point K or measurement location along the translation path (e.g., the C-C direction) such that each second 1D beam profile and its corresponding first 1D beam profile are mirror images of one another with respect to a vertical line (e.g., line E in FIG. 3E) passing through the first point K.

In an alternate embodiment, to calculate each of the plurality of third 1D beam profiles, the beam current density values of each spatially inverted second 1D beam profile (e.g., second 1D beam profile 58 in FIG. 3E) and its corresponding first 1D beam profile (e.g., first 1D beam profile 56 in FIG. 3E) are multiplied by a constant (e.g., two). A value of the constant may correspond to amount of times a wafer will be subsequently rotated during the implantation process. Subsequently, the multiplied beam current density values of each spatially inverted second 1D beam profile are added to (or superposed with) the doubled beam current density values of its corresponding first 1D beam profile with respect to a first point K or measurement location along the translation path (e.g., the C-C direction) such that each second 1D beam profile and its corresponding first 1D beam profile are mirror images of one another with respect to a vertical line (e.g., line E in FIG. 3E) passing through the first point K. In an embodiment, the number of first 1D beam profiles of the plurality of first 1D beam profiles and the number of second 1D beam profiles of the plurality of second 1D beam profiles is the same. In an embodiment, the number of first 1D beam profiles of the plurality of first 1D beam profiles and the number of third 1D beam profiles of the plurality of third 1D beam profiles is the same.

In the step shown in flowchart block 70, all the calculated beam current density values of the plurality of third 1D beam profiles that were generated during the step shown in flowchart block 68 of FIG. 3A are added (or superposed) together to obtain a combined 1D beam profile. Subsequently, as shown in flowchart block 72, the average 1D beam profile is calculated, by dividing the beam current density values of the combined 1D beam profile by the number of third 1D beam profiles in the plurality of third 1D beam profiles.

In the step shown in flowchart block 74, the average 1D beam profile generated in flowchart block 72 of FIG. 3A is then compared to an "optimal" or "golden" beam profile 90 (shown in FIG. 3F) that is stored in memory of the ion implantation system 18 or on the controller 52. The optimal beam profile 90 is acquired from previously performed ion implantation processes 100 on wafers (e.g. similar to wafer 34). After the ion implantation processes 100 are performed on the wafers, each wafer undergoes a thermal wave map measurement to measure the reflectance of the wafer, which is used generate a corresponding thermal wave uniformity profile. Thermal wave measurements (and therefore the thermal wave uniformity profile) on each wafer show a high degree of correlation to the ion implantation uniformity on the implanted wafer. The thermal wave measurement may involve scanning the wafer with an ion beam. A plurality of these thermal wave uniformity profiles which show good or optimal uniformity values are selected and their corresponding average 1D beam profiles (previously generated in a manner similar to that shown above in flowchart blocks 62 through 72) are added (e.g., superposed) together. Subsequently, an optimal beam profile 90 is calculated by obtaining the average of these superposed average 1D beam profiles (e.g., by dividing the beam current density values of the superposed average 1D beam profiles by the number of thermal wave uniformity profiles in the selected plurality of thermal wave uniformity profiles). The optimal beam profile 90 can then be compared to the average 1D beam profile of the ion beam 26 that was generated in flowchart block 72 to confirm that the ion beam 26 profile is within specification. The optimal beam profile 90 can be updated with average 1D beam profiles of other selected thermal wave uniformity profiles that show good or optimal uniformity values as they are acquired.

Advantages can be achieved as a result of measuring a profile of the ion beam 26 using the ion beam profiler 38 prior to performing an ion implantation process 100 on a wafer 34. The ion beam profiler 38 is configured to acquire a 2D beam profile of the ion beam 26, which is then used to generate a plurality of first one-dimensional (1D) profiles of the ion beam 26, a plurality of second spatially inverted 1D beam profiles for each of the first 1D beam profiles, and a plurality of third 1D beam profiles calculated by adding (or superposing) the beam current density values of each of the spatially inverted second 1D beam profiles to the beam current density values of its corresponding first 1D beam profile. An average 1D beam profile is calculated from the plurality of third 1D beam profiles, which is then compared to the optimal beam profile 90 to determine whether the ion implantation process 100 can be performed on the wafer 34 or if adjustments to the beam profile of the ion beam 26 should be made. The advantages may include better ion beam uniformity tuning and improved ion implantation uniformity on the wafer 34 and during ion implantation process 100. In addition, the disclosed method may be integrated easily into existing processes without requiring any hardware changes, which reduces manufacturing costs.

Referring further to flowchart block 74, the average 1D beam profile generated in flowchart block 72 is normalized to an average value of the optimal beam profile 90 (shown in FIG. 3F) within a selected sampling region 92. The selected sampling region 92 may be in a range from +30 mm to +120 mm, and −30 and −120 mm on either side of a vertical line that passes through the center point (e.g., at 0 mm) of the average 1D beam profile as shown in the FIG. 3F. Subsequently, the controller 52 calculates the standard deviation of the average 1D beam profile as compared to the optimal beam profile 90.

As shown in flowchart block 76 of FIG. 3A, if the average 1D beam profile in the sampling region 92 has a standard deviation of less than a preset threshold (e.g., 0.07) as compared to the optimal beam profile 90, the ion beam 26 profile is regarded as being within specification and the ion implantation process 100 proceeds on wafer 34 (shown in FIG. 1). If the standard deviation of the average 1D beam profile as compared to the optimal beam profile 90 is equal to or greater than the preset threshold (e.g., 0.07), the ion beam 26 profile is regarded as being outside of the required specification and the ion implantation process 100 does not proceed. Instead, the controller 52 may employ a feedback algorithm through which the controller 52 may send signals to adjust the beam profile by tuning various parameters (shown in flowchart block 78) of the ion beam 26, such as beam intensity, beam height, angle of incidence of the beam (also referred to as beam angle), angle of divergence of the beam (also referred to as beam divergent angle), and beam width, or the like, to bring the standard deviation of the average 1D beam profile as compared to the optimal profile to less than the preset threshold (e.g., 0.07). After the tuning of the ion beam 26 is performed, an updated average 1D beam profile may be acquired to confirm the adjustment and check if the tuned ion beam 26 falls within the required specification.

The controller 52 may be used to perform many of the steps of the process flow of FIG. 3A to generate an average 1D beam profile and determine whether to continue with an implantation based on the generated average 1D beam profile. The controller 52 may be realized with either hardware or software. In some embodiments, the controller 52 includes a circuit such as an application-specific integrated circuit (ASIC), a field programmable gate array (FPGA), or the like. In some embodiments, the controller 52 is a computer which includes a processor operable to execute programming. The controller 52 is illustrated as a single element for illustrative purposes. In some embodiments, the controller 52 includes multiple elements. The controller 52 may include storage (e.g., volatile or non-volatile memory) configured to store parameters for implementing process blocks of FIG. 3A. The parameters may be hardcoded or input to the controller 52 through an input device.

The embodiments of the present disclosure have some advantageous features. The embodiments include measuring a profile of an ion beam using an ion beam profiler prior to performing a first ion implantation process on a first wafer. The ion beam profiler is configured to produce sensor signals in response to incident ions of the ion beam along a translation path with respect to the ion beam. The acquired sensor signals are representative of a two-dimensional (2D) profile of the ion beam. The 2D profile of the ion beam is then processed and compared to a baseline, "optimal" or "golden" beam profile to determine whether the first ion implantation process can proceed or if adjustments to the beam profile of the ion beam implantation tool should be made. One or more embodiments disclosed herein may allow for better ion beam uniformity tuning and improved ion implantation uniformity on the first wafer and during the first ion implantation process. In addition, the disclosed method may be integrated easily into existing processes without requiring any hardware changes, which reduces manufacturing costs.

In accordance with an embodiment, a method for ion implantation of a wafer includes moving a plurality of sensors along a translation path with respect to an ion beam; acquiring sensor signals produced by the plurality of sensors at a plurality of positions along the translation path; converting the acquired sensor signals into a data set representative of a two-dimensional (2D) profile of the ion beam; generating a plurality of first one-dimensional (1D) profiles of the ion beam from the data set, each of the plurality of first 1D profiles having a first set of current density values; generating a plurality of second 1D profiles of the ion beam by spatially inverting each of the plurality of first 1D profiles of the ion beam, each of the plurality of second 1D profiles having a second set of current density values; generating a plurality of third 1D profiles of the ion beam by superposing the first current density values of each of the plurality of first 1D profiles with the second current density values of a corresponding one of the plurality of second 1D profiles; determining whether to continue an implantation process on the wafer with the ion beam in accordance with the plurality of third 1D profiles; and in response to determining to continue the implantation process, performing the implantation process on the wafer with the ion beam. In an embodiment, the plurality of sensors include at least eleven sensors that are spaced out in a linear fashion in a direction that is perpendicular to the translation path. In an embodiment, generating the plurality of third 1D profiles of the ion beam includes superposing the first current density values of each of the plurality of first 1D profiles with the second current density values of a corresponding one of the plurality of second 1D profiles with respect to a first point along the translation path, such that each of the plurality of first 1D profiles and its corresponding one of the plurality of second 1D profiles are mirror images of one another with respect to a vertical line passing through the first point. In an embodiment, the method further includes superposing third current density values of each the plurality of third 1D profiles of the ion beam to generate superposed current density values of the plurality of third 1D profiles of the ion beam; and calculating an average 1D profile of the ion beam from the superposed current density values of the plurality of third 1D profiles of the ion beam. In an embodiment, the method further includes calculating a standard deviation of the average 1D profile of the ion beam as compared to an optimal profile, the optimal profile being stored on a controller. In an embodiment, the method further includes adjusting parameters of the ion beam when the standard deviation is equal to or greater than a preset threshold. In an embodiment, determining whether to continue the implantation process on the wafer with the ion beam in accordance with the plurality of third 1D profiles includes determining to continue the implantation process when the standard deviation is less than the preset threshold. In an embodiment, the parameters of the ion beam include beam intensity, beam height, beam width, or a combination thereof.

In accordance with an embodiment, a method for ion beam uniformity tuning includes generating an ion beam in an ion implantation system; acquiring a data set representative of a two-dimensional (2D) profile of the ion beam; generating a plurality of first one-dimensional (1D) profiles of the ion beam from the data set; generating a plurality of second 1D profiles of the ion beam from the plurality of first 1D profiles of the ion beam; superposing current density values of the plurality of second 1D profiles of the ion beam to generate a combined 1D profile of the ion beam; calculating an average 1D profile of the ion beam by dividing current density values of the combined 1D profile by a quantity of second 1D profiles in the plurality of second 1D profiles of the ion beam; and determining whether to continue an implantation process with the ion beam in accordance with the average 1D profile of the ion beam. In an embodiment, acquiring the data set representative of the two-dimensional (2D) profile of the ion beam further includes moving an ion beam profiler along a translation path covering a cross-sectional area of the ion beam. In an embodiment, generating a plurality of second 1D profiles of the ion beam from the plurality of first 1D profiles of the ion beam includes generating a plurality of third 1D profiles of the ion beam by spatially inverting each of the plurality of first 1D profiles of the ion beam, each of the plurality of first 1D profiles having a first set of current density values and each of the plurality of third 1D profiles having a second set of current density values; and superposing the first current density values of each of the plurality of first 1D profiles with the second current density values of a corresponding one of the plurality of third 1D profiles with respect to a first point along the translation path, such that each of the plurality of first 1D profiles and its corresponding one of the plurality of third 1D profiles are mirror images of one another with respect to a vertical line passing through the first point. In an embodiment, the ion beam profiler includes a plurality of sensors that are spaced out in a linear fashion in a direction that is perpendicular to the translation path. In an embodiment, the method further includes calculating a standard deviation of the average 1D profile of the ion beam as compared to an optimal profile, where the optimal profile includes an average of a plurality of 1D thermal wave uniformity profiles. In an embodiment, the method further includes adjusting beam intensity, beam height, beam width, or a combination thereof of the ion beam when the standard deviation is equal to or greater than a preset threshold.

In accordance with an embodiment, a method includes moving an ion beam profiler along a translation path with respect to an ion beam such that the ion beam profiler covers an entire cross-sectional area of the ion beam; acquiring a data set representative of a two-dimensional (2D) profile of the ion beam using a plurality of sensors on the ion beam profiler, the plurality of sensors being spaced out in a linear fashion in a direction that is perpendicular to the translation path; generating a first one-dimensional (1D) profile of the ion beam from the data set; and calculating a standard deviation of the first 1D profile of the ion beam as compared to an optimal beam profile, where the optimal beam profile includes an average of a plurality of second 1D profiles. In an embodiment, the ion beam profiler is moved by a first distance of up to 200 mm. In an embodiment, each of the plurality of sensors includes a faraday cup. In an embodiment, each of the plurality of second 1D profiles corresponds to a respective optimal ion implantation process that was previously performed. In an embodiment, the first 1D profile of the ion beam is normalized to an average value of the optimal beam profile within a first sampling region. In an embodiment, generating the first 1D profile of the ion beam includes generating a plurality of third 1D profiles of the ion beam from the data set representative of the 2D profile of the ion beam, where the data set is acquired from a region of the ion beam profiler that extends from −50 mm to +50 mm on either side of a vertical center line of the ion beam profiler, each of the plurality of third 1D profiles having a first set of current density values; generating a plurality of fourth 1D profiles of the ion beam from the plurality of third 1D profiles, each of the plurality of fourth 1D profiles having a second set of current density values; superposing the first current density values of each of the plurality of third 1D profiles with the second current density values of a corresponding one of the plurality of fourth 1D profiles to generate a plurality of fifth 1D profiles of the ion beam; superposing current density values of the plurality of fifth 1D profiles of the ion beam to generate a combined 1D profile of the ion beam; and calculating an average 1D profile of the ion beam by dividing current density values of the combined 1D profile by a quantity of fifth 1D profiles in the plurality of fifth 1D profiles of the ion beam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for ion implantation of a wafer, the method comprising:

moving a plurality of sensors along a translation path with respect to an ion beam;

acquiring sensor signals produced by the plurality of sensors at a plurality of positions along the translation path;

converting the acquired sensor signals into a data set representative of a two-dimensional (2D) profile of the ion beam;

generating a plurality of first one-dimensional (1D) profiles of the ion beam from the data set, each of the plurality of first 1D profiles having a first set of current density values;

generating a plurality of second 1D profiles of the ion beam by spatially inverting each of the plurality of first 1D profiles of the ion beam, each of the plurality of second 1D profiles having a second set of current density values;

generating a plurality of third 1D profiles of the ion beam by superposing the first current density values of each of the plurality of first 1D profiles with the second current density values of a corresponding one of the plurality of second 1D profiles;

determining whether to continue an implantation process on the wafer with the ion beam in accordance with the plurality of third 1D profiles; and in response to determining to continue the implantation process, performing the implantation process on the wafer with the ion beam.

2. The method of claim 1, wherein the plurality of sensors comprise at least eleven sensors that are spaced out in a linear fashion in a direction that is perpendicular to the translation path.

3. The method of claim 1, wherein generating the plurality of third 1D profiles of the ion beam comprises superposing the first current density values of each of the plurality of first 1D profiles with the second current density values of a corresponding one of the plurality of second 1D profiles with respect to a first point along the translation path, such that each of the plurality of first 1D profiles and its corresponding one of the plurality of second 1D profiles are mirror images of one another with respect to a vertical line passing through the first point.

4. The method of claim 1, further comprising:
    superposing third current density values of each of the plurality of third 1D profiles of the ion beam to generate superposed current density values of the plurality of third 1D profiles of the ion beam; and
    calculating an average 1D profile of the ion beam from the superposed current density values of the plurality of third 1D profiles of the ion beam.

5. The method of claim 4, further comprising comparing the average 1D profile of the ion beam to an optimal profile, the optimal profile being stored on a controller.

6. The method of claim 5, further comprising adjusting parameters of the ion beam based on the comparison of the average 1D profile of the ion beam to the optimal profile.

7. The method of claim 6, wherein the ion beam has a rectangular cross section or a circular cross section.

8. The method of claim 7, wherein the parameters of the ion beam comprise beam intensity, beam height, beam width, or a combination thereof.

9. A method for ion beam uniformity tuning, the method comprising:
    generating an ion beam in an ion implantation system;
    acquiring a data set representative of a two-dimensional (2D) profile of the ion beam;
    generating a plurality of first one-dimensional (1D) profiles of the ion beam from the data set;
    generating a plurality of second 1D profiles of the ion beam from the plurality of first 1D profiles of the ion beam;
    superposing current density values of the plurality of second 1D profiles of the ion beam to generate a combined 1D profile of the ion beam;
    calculating an average 1D profile of the ion beam by dividing current density values of the combined 1D profile by a quantity of second 1D profiles in the plurality of second 1D profiles of the ion beam; and
    determining whether to continue an implantation process with the ion beam in accordance with the average 1D profile of the ion beam.

10. The method of claim 9, wherein acquiring the data set representative of the two-dimensional (2D) profile of the ion beam further comprises moving an ion beam profiler along a translation path covering a cross-sectional area of the ion beam.

11. The method of claim 10, wherein generating a plurality of second 1D profiles of the ion beam from the plurality of first 1D profiles of the ion beam comprises:
    generating a plurality of third 1D profiles of the ion beam by spatially inverting each of the plurality of first 1D profiles of the ion beam, each of the plurality of first 1D profiles having a first set of current density values and each of the plurality of third 1D profiles having a second set of current density values; and
    superposing the first current density values of each of the plurality of first 1D profiles with the second current density values of a corresponding one of the plurality of third 1D profiles with respect to a first point along the translation path, such that each of the plurality of first 1D profiles and its corresponding one of the plurality of third 1D profiles are mirror images of one another with respect to a vertical line passing through the first point.

12. The method of claim 10, wherein the ion beam profiler comprises a plurality of sensors that are spaced out in a linear fashion in a direction that is perpendicular to the translation path.

13. The method of claim 9, further comprising comparing the average 1D profile of the ion beam to an optimal profile, wherein the optimal profile comprises an average of a plurality of 1D thermal wave uniformity profiles.

14. The method of claim 13, further comprising adjusting beam intensity, beam height, beam width, or a combination thereof of the ion beam based on the comparison of the average 1D profile of the ion beam to the optimal profile.

15. A method comprising:
    moving an ion beam profiler along a translation path with respect to an ion beam such that the ion beam profiler covers an entire cross-sectional area of the ion beam;
    acquiring a data set representative of a two-dimensional (2D) profile of the ion beam using a plurality of sensors on the ion beam profiler, the plurality of sensors being spaced out in a linear fashion in a direction that is perpendicular to the translation path;
    generating a first one-dimensional (1D) profile of the ion beam from the data set, wherein generating the first 1D profile of the ion beam comprises:
        generating a plurality of second 1D profiles of the ion beam from the data set representative of the 2D profile of the ion beam, wherein the data set is acquired from a region of the ion beam profiler that extends from −50 mm to +50 mm on either side of a vertical center line of the ion beam profiler, each of the plurality of second 1D profiles having a first set of current density values;
        generating a plurality of third 1D profiles of the ion beam from the plurality of second 1D profiles, each of the plurality of third 1D profiles having a second set of current density values; and
        superposing the first current density values of each of the plurality of second 1D profiles with the second current density values of a corresponding one of the plurality of third 1D profiles to generate a plurality of fourth 1D profiles of the ion beam; and
    comparing the first 1D profile of the ion beam to an optimal beam profile, wherein the optimal beam profile comprises an average of a plurality of fifth 1D profiles.

16. The method of claim 15, wherein the ion beam profiler is moved by a first distance of up to 200 mm.

17. The method of claim 15, wherein each of the plurality of sensors comprises a faraday cup.

18. The method of claim 15, wherein each of the plurality of fifth 1D profiles corresponds to a respective optimal ion implantation process that was previously performed.

19. The method of claim 18, wherein the first 1D profile of the ion beam is normalized to an average value of the optimal beam profile within a first sampling region.

20. The method of claim 15, wherein generating the first 1D profile of the ion beam further comprises:

superposing current density values of the plurality of fourth 1D profiles of the ion beam to generate a combined 1D profile of the ion beam; and calculating an average 1D profile of the ion beam by dividing current density values of the combined 1D profile by a quantity of fourth 1D profiles in the plurality of fourth 1D profiles of the ion beam.

* * * * *